(12) United States Patent
Heinke et al.

(10) Patent No.: US 7,589,545 B2
(45) Date of Patent: Sep. 15, 2009

(54) DEVICE FOR FINAL INSPECTION

(75) Inventors: Matthias Heinke, Heilbronn (DE); Heinrich Wieczorek, Obereisesheim (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 11/711,685

(22) Filed: Feb. 28, 2007

(65) Prior Publication Data

US 2007/0205789 A1 Sep. 6, 2007

Related U.S. Application Data

(60) Provisional application No. 60/781,382, filed on Mar. 13, 2006.

(30) Foreign Application Priority Data

Mar. 1, 2006 (DE) ........................ 10 2006 009 321

(51) Int. Cl.
*G01R 31/02* (2006.01)
(52) U.S. Cl. ...................................... 324/760; 324/765
(58) Field of Classification Search .......... 324/754–765
See application file for complete search history.

(56) References Cited

U.S. PATENT DOCUMENTS

| | | | | |
|---|---|---|---|---|
| 3,408,565 A | | 10/1968 | Frick et al. | |
| 3,641,972 A | * | 2/1972 | Hostetter | 118/712 |
| 4,787,752 A | * | 11/1988 | Fraser et al. | 374/45 |
| 5,065,089 A | | 11/1991 | Rich | |
| 6,369,598 B2 | * | 4/2002 | Porter et al. | 324/761 |
| 6,507,206 B1 | * | 1/2003 | Vesaruch et al. | 324/760 |
| 6,741,090 B2 | * | 5/2004 | Yamashita | 324/755 |
| 6,888,363 B1 | * | 5/2005 | Bolde et al. | 324/760 |
| 2001/0030551 A1 | | 10/2001 | Porter, Jr. et al. | |
| 2003/0151421 A1 | * | 8/2003 | Leedy | 324/760 |
| 2004/0222809 A1 | | 11/2004 | Leedy | |
| 2005/0062463 A1 | | 3/2005 | Kim | |
| 2005/0151549 A1 | * | 7/2005 | Okumura et al. | 324/756 |
| 2005/0225346 A1 | * | 10/2005 | Saito et al. | 324/760 |

FOREIGN PATENT DOCUMENTS

WO WO 03/027689 A1 4/2003

\* cited by examiner

*Primary Examiner*—Ha Tran T Nguyen
*Assistant Examiner*—Arleen M Vazquez
(74) *Attorney, Agent, or Firm*—Muncy, Geissler, Olds & Lowe, PLLC

(57) ABSTRACT

A device is provided for subjecting a plurality of singulated semiconductor components to functional verification, which includes contact pins that are integrated in a test socket and establish a mechanical and electrical contact between the test socket and the integrated semiconductor circuits, a holding fixture (DUT board) connected to the test socket for transmitting electrical signals to and from a program-controlled electronic switching system, and lines and control devices for operating at least one pneumatic transport and holding device for picking up, orienting and positioning the singulated semiconductor components, an inert gas is provided as the medium for operating the pneumatic devices.

11 Claims, 2 Drawing Sheets

DEVICE FOR FINAL INSPECTION

This nonprovisional application claims priority to German Patent Application No. DE 102006009321, which was filed in Germany on Mar. 1, 2006, and to U.S. Provisional Application No. 60/781,382, which was filed on Mar. 13, 2006, and which are both herein incorporated by reference.

BACKGROUND OF THE INVENTION

1. Field of the Invention

The present invention relates to a device for testing various semiconductor components, including integrated semiconductor circuits, known as ICs (integrated circuits).

2. Description of the Background Art

After integrated semiconductor circuits have been singulated, they undergo functional verification in a test step. To this end, ICs are brought into contact with test sockets in a test device in order to test the individual components for functionality. These test devices are usually called "IC testers" or "IC handlers."

Although the invention is described below with reference to ICs as typical semiconductor components, it is noted that the invention is not limited thereto.

Typically components are loaded into a loading area of the handler, either loose, or in plastic tubes or in metal magazines, and then are transported to the test section of the handler as a function of the loading method.

The handlers designed for handling the components contain transport devices that provide for the continuous delivery and correct orientation of the individual ICs to the test sockets by means of pneumatic, mechanical, or manual control. The test sockets include contact units with, depending on the number of contacts of the IC, up to a hundred contact pins, known as pogo pins, which are arranged to correspond to the circuit to be tested. The test sockets, in turn, are arranged on a DUT board, which is located on the outside of the handler and has electrical contact devices connecting it to a program-controlled signal generator.

The contacting takes place inside a chamber in which the semiconductor components are heated or cooled to the desired test temperature. After a certain holding time in the chamber, for the purpose of temperature equalization, the ICs are individually picked up by the holding devices that have carrier heads with vacuum pumps and that hold the components by suction. With the aid of the carrier heads, the ICs are then pressed against the contact pins of the test sockets to produce contact between the terminals of the ICs and the test socket. After the function of an integrated semiconductor circuit has been tested, the vacuum pump at the carrier heads is briefly deactivated and an air blast is activated by means of compressed air so that the IC is released from the carrier head.

During the contacting, the program-controlled signal generator transmits test signals through the test socket on the DUT board to the electronic circuits on the IC and analyzes the response signals that come back from the IC. In addition, voltage and current flow in the semiconductor circuits are tested during the course of the functional inspection. The requirements on the contact pins are very complex here. Contact pins are generally made of steel and coated with a hard material that has a low electrical resistance and high conductivity.

Experience has shown, on the one hand, that oxides, which increase the transition resistance, form on the outer surfaces of the contact pins after a few test cycles. This significantly reduces the service life of the contact pins or of the entire test socket.

On the other hand, the problem in testing ICs is that the contact areas or solder joints of an electronic component typically has a metallic material, for example tin solder or aluminum, which forms an oxide layer on its surface in air. This oxide layer is often harder than the pure metallic material. When the contact pins are pressed against the contact area, this metal oxide layer, which has a thickness of several µm, must be overcome. Conventional contact pins have an internal spring that makes it possible to exert a high normal force on the contact point of the IC with the tip of the contact pin during the tests, thus penetrating the metal oxide layer. In this process, the test pins are mechanically stressed, and in addition small quantities of metal oxide are deposited on the tips of the contact points during each test sequence.

It is precisely these deposits of metal oxide that are problematic, since they can react with the metal of the contact pins as a function of the metals, temperatures, and pressures that are present in each case. Furthermore, the tin of the solder connections can also diffuse into the contact tips, altering the metallic structure there.

Depending on whether the ICs are for use at high, low or room temperatures, the temperature in the holding chamber is set up in accordance with the test program. If the chamber is to be cooled, liquid nitrogen is used, which arrives at the chamber through separate lines. In contrast, heating of the chamber is accomplished through air, which is also used for supplying compressed air to the pneumatically driven transport devices. During testing at room temperature, contacting of the ICs takes place in an open system rather than a closed one. As a result, fresh oxygen is provided to the electronic components just before the test phase at room temperature or at high temperatures, which promotes oxide formation at the surface of the contact pins and at the surface of the contact areas or solder joints of the ICs.

Because of these circumstances, the contact pins, and hence the test sockets as a whole, wear very quickly. Replacing the contact pins is very expensive, however, since it not only requires the requisite material, but also down time in the test phase, during which the entire test device or the entire handler is idle.

Consequently, a variety of cleaning methods for the tips of the contact pins are known from current practice, such as mechanical or chemical cleaning of the contact pins, to improve the measurement reliability. However, these methods are beset by the disadvantage that the contact pins can be damaged during cleaning, or chemical residues may remain on the contact pins.

For this reason, attempts have been made to produce contact pins with a surface of metal that does not oxidize or only oxidizes minimally. To this end, metals such as gold, silver, platinum, palladium, iridium, rhenium, mercury, and osmium are used, which generally are less reactive with respect to oxygen and have advantageous physical and electrical properties. In addition, the shape of the surfaces of the contact pin tips has been varied in order to achieve the smallest possible surface, and thus to minimize the contact area between the pins and the ICs.

WO 03027689 A1 discloses a contact pin whose surface is coated with a palladium-cobalt alloy to reduce the adhesion of metal oxide deposits from the tin solder on the contact points. However, this increases the electrical resistance of these contact pins relative to those having a coating of nickel or gold.

A disadvantage of the conventional processes is that they are either time intensive or very costly on account of the use of expensive materials and manufacturing processes.

SUMMARY OF THE INVENTION

It is therefore an object of the present invention to increase the service life of the contact pins and improve the measurement reliability of the test device while avoiding the aforementioned disadvantages.

Accordingly, in an aspect of the invention an inert gas is provided as the medium for operation of the pneumatic system in a device with which a number of singulated semiconductor components are subjected to a functional verification. In this context, this device includes contact pins that are integrated in a test socket and that establish a mechanical and electrical contact between the test socket and the integrated semiconductor circuits, a DUT board connected to the test socket for transmitting electrical signals to and from a program-controlled electronic switching system, a pneumatic system with lines and control devices for operating at least one transport device, and at least one holding device for picking up, orienting and positioning the singulated semiconductor components.

Investigations by the applicant have shown that the use of the aforementioned device prevents air or compressed air from the transport system from reaching the region for contacting the ICs. The displacement of the air around the contact region of the ICs produces several advantages at once in the functional verification. Firstly, the contact resistance at the contact areas of the integrated circuit is lower, since oxidation of the contact areas in the region of the contacting is considerably reduced. Secondly, no oxide can form on the metal surfaces of the contact pin points because of the inert atmosphere.

In a further embodiment of the invention, an inert gas, such as nitrogen, is provided for entry. Liquid nitrogen is already used to cool the ICs for testing at low temperatures. By using nitrogen as compressed air in the pneumatic system, it is possible to prevent even small quantities of normal atmosphere or reactive oxygen from entering the device.

According to an embodiment of the invention, the lines and control devices of the pneumatic transport and holding device are also provided as flushing devices for the test sockets, the contact pins, and the semiconductor components. This means that nozzles that serve to transport the ICs can be intentionally operated to produce an inert atmosphere in the measurement chamber or to remove particles on contact pins, etc.

A further embodiment provides that the device contains a temperature regulating device which includes multiple channels and nozzles for controlling the temperature in a holding chamber and in the contact region of the test device, wherein an inert gas is provided as the medium for heating the holding chamber and/or the contact region. It has proven advantageous to provide the gas from the lines and control devices of the pneumatic transport and holding device to supply the temperature regulating device and for temperature control of the semiconductor components.

Another embodiment of the invention provides for additional lines and control devices to be provided in the pneumatic transport and holding device and/or temperature regulating device, by which means flushing processes with inert gas can be controlled independently of programmed test processes. This means that even when testing ICs at room temperature or high temperatures, the nozzles of the test device are controllable such that heated inert gas can be directed into the contact region through manual actuation as needed and independently of automatically running test programs.

In this context, the method for testing a plurality of singulated electronic semiconductor components, preferably semiconductor circuits, is carried out in the following steps. Once they have exited the environmental chamber, the individual components are first picked up by means of a holding head and are then positioned relative to a test socket with contact pins. Because the transport of the components inside the pneumatic holding and transport device takes place by means of an inert gas, the components and the test socket are substantially simultaneously flushed by the nozzles during further transport of the ICs. The integrated electronic circuits located on the components are then contacted and an electrical connection is established between the component and a test socket. The steps "pickup," "position," "flush," and "contact" are repeated until the testing has been completed on all components located within the device.

A further embodiment provides for the components to be cooled or heated to a defined test temperature by means of a fluid and/or gaseous inert media in a step prior to contacting.

An embodiment further provides that heating of the components for testing at high temperatures is accomplished in a holding chamber intended for this purpose by means of gaseous nitrogen, which is taken from the lines and control devices of the pneumatic holding and transport device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
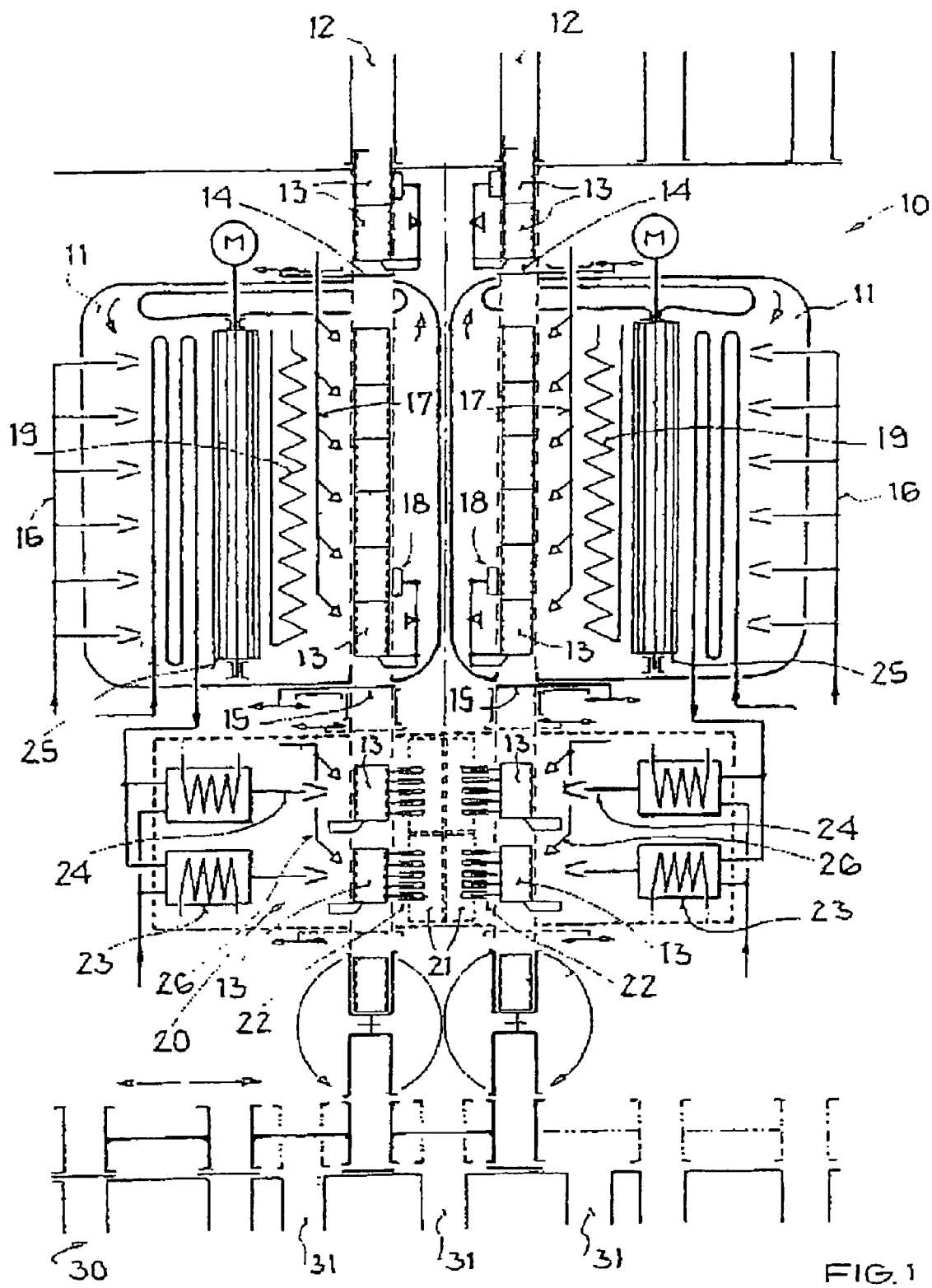
FIG. 1 schematically shows a section through an environmental chamber and a contact region of a handler, according to an embodiment of the present invention.

FIG. 1 shows an environmental chamber 10 of a handler with a left-hand and a right-hand holding chamber 11. Singulated ICs 13 are supplied to the environmental chamber 10 through loading devices 12. The holding chambers 11 are each closed off from the open areas of the handler by a chamber entry closure 14 and a chamber exit closure 15 in order to heat or cool the ICs 13 for testing to a defined test temperature.

Three temperature ranges are distinguished. During testing at low temperatures, which takes place at approximately −40° C., liquid nitrogen is supplied to the holding chambers 11 through separate lines and nozzles 16. Normally, temperature regulation of the ICs 13 is accomplished under program control, so no influences can act on the atmosphere inside the environmental chamber 10. Transport of the ICs 13 inside the environmental chamber 10 takes place by means of a pneumatically controlled device with lines and nozzles 17. In addition, holding devices 18 are located in the loading devices 12, providing for singulation of the ICs 13 for entry into a contact region 20.

After exiting the holding chamber 11, the ICs 13 are transported to a measuring position in the contact region 20 by means of additional lines and control devices 26 of the pneumatic transport device. Here, the ICs are contacted by a test socket 21, which contains a number of contact pins 22 (pogo pins) corresponding to the contacts of the ICs, and an electrical and mechanical connection is established. The test socket 21, in turn, stands in contact with a DUT board (not shown), which is located on the outside of the handler and includes a project-specific measurement circuit arrangement and serves to simultaneously analyze and forward the signals to a signal generator.

During measurement at low temperatures, a temperature gradient of 60° C. often occurs between the IC 13 and the outside of the DUT board, which can lead to condensation and to the formation of moisture in the contact region 20. Constant temperatures and constant humidity are critical for constant measurement quality, however. Because of the use of an inert gas for cooling the ICs 13, gas containing oxygen is displaced from the contact region 20 by inert gas when the ICs 13 exit from the holding chamber 11, so that adverse effects on the contact pins 22 or contact points cannot occur.

The situation is different in the case of measurements at room temperature, since no nitrogen has to be used for cooling. In accordance with the present invention, therefore, the lines and control devices 17, 26 of the pneumatic transport devices are used to displace reactive gases from the contact region 20. To this end, nitrogen is used for operating the pneumatic transport and holding device as a whole, so the lines and nozzles 17, 26 of the pneumatic devices introduce nitrogen into the contact region 20 when transporting the ICs 13. Furthermore, the nozzles 24, which otherwise are used for fine adjustment of the temperature in the contact region 20, are also equipped with additional valves and control devices, which likewise can be actuated independently of preprogrammed measurement sequences, so that nitrogen can be supplied at regular intervals, for instance.

In the case of measurement at high temperatures of up to 170° C., the ICs 13 in the holding chamber 11 are brought to the desired test temperature by means of an inert gas which is heated by a heater 19 and distributed in the holding chamber 11 by means of a squirrel cage blower 27. In the present invention, the gas from the pneumatic transport and holding device is used here. The gas from the pneumatic transport and holding device is also used for fine adjustment of the temperature, for which the nozzles 24 are provided. When necessary, this gas is heated by additional heater coils 23 in the contact region 20. Due to the use of an inert gas throughout the handler, gas that contains oxide is displaced from the environmental chambers 10 and contact region 20, so oxide deposits which would distort the measurement results do not form at the contact surfaces of the ICs 13 or on the contact pins 22. Consequently, the service life of the test socket is significantly increased as a whole.

Upon conclusion of the measurement, the ICs 13 are transported to a sorting device 30, where faulty ICs are separated from functional ICs, and fed to corresponding receiving tubes 31.

Figure 2:
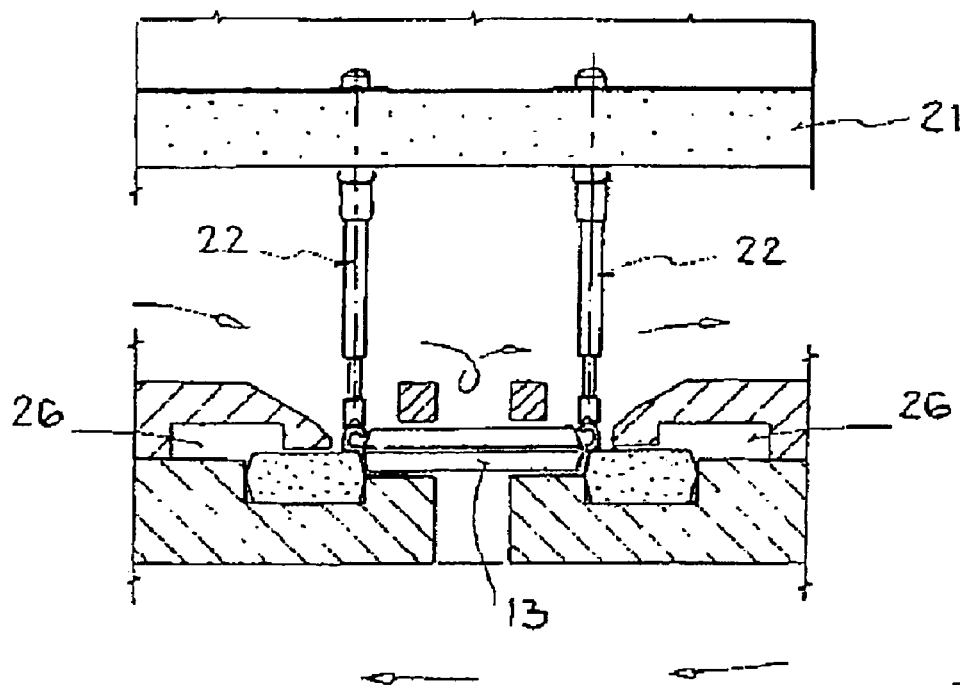
FIG. 2 shows a detail view of the contact region of the handler.

FIG. 2 shows a detail view of two contact pins 22, whose tips touch the contact points of an IC 13. During contact, the program-controlled signal generator transmits test signals through a test socket 21 on the DUT board to the electronic circuits on the IC 13, and analyzes the response signals returned by the IC 13.

Depending on the type of handler, transport of the ICs 13 can be accomplished by means of gas streams supplied through lines and transport nozzles 26, or also on the basis of gravitation or by means of pump cylinders. In the latter two versions, however, the injection of gas that serves to accelerate the ICs or correct faults can also take place. It has been shown in practice that the injection of inert gas reduces the formation of oxides on the outer surface of the contact pins 22, significantly increasing the service life of the contact pins and the entire test socket.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for subjecting a plurality of singulated semiconductor components to functional verification, the device comprising:

contact pins that are integrated in a test socket and that establish a mechanical and electrical contact between the test socket and the integrated semiconductor circuits;

a holding fixture connectable to the test socket for transmitting electrical signals to and from a program-controlled electronic switching system;

lines and control devices for operating at least one pneumatic transport and holding device for picking up, orienting, and positioning the singulated semiconductor components;

wherein an inert gas is provided as a medium for operating the pneumatic devices and for displacing air in regions of said contact between the test socket and the integrated semiconductor circuits in order to reduce contact resistance in said regions and prevent oxide formation on said contact pins.

2. The device according to claim 1, wherein the medium is nitrogen.

3. The device according to claim 1, wherein the lines and control devices of the pneumatic transport and holding device are provided as flushing devices for at least one of the test sockets, the contact pins, and the semiconductor components.

4. The device according to claim 1, further comprising a temperature regulating device that includes a plurality of channels and nozzles for controlling the temperature in a holding chamber and in the contact region of the test device, wherein an inert gas is provided as the medium for heating at least one of the holding chamber and the contact region.

5. The device according to claim 4, wherein the channels and nozzles of the temperature regulating device are provided as flushing devices for at least one of the test sockets, the contact pins, and the semiconductor components.

6. The device according to claim 4, wherein only one gas source is provided for supplying gas to the temperature regulating device and for temperature control of the semiconductor components and for supplying gas to the lines and control devices of the pneumatic transport and holding device.

7. The device according to claim 4, wherein additional lines and control devices are provided in at least one of the pneumatic transport and holding device and/or temperature regulating device, by which flushing processes with inert gas are controlled independently of programmed test processes.

8. A method for testing a plurality of singulated electronic semiconductor components, the method comprising:

picking up an individual semiconductor component by a holding head; positioning the semiconductor component relative to a test socket with contact pins;

flushing the semiconductor components and the test socket with an inert gas taken from a pneumatic holding and transport device;

contacting the integrated electronic circuits located on the semiconductor components; and establishing an electrical connection between semiconductor component and a test socket, wherein the steps of picking up, positioning, flushing, and contacting are repeated, and wherein said step of flushing with an inert gas displaces air in regions of said connection between the test socket and the integrated electronic circuits in order to reduce contact resistance in said regions and prevent oxide formation on said contact pins.

9. The method according to claim 8, wherein the semiconductor components are cooled or heated to a defined test temperature by at least one of a fluid and gaseous inert media in a step prior to contacting.

10. The method according to claim 9, wherein heating of the semiconductor components for testing at high temperatures is accomplished in a holding chamber by a gaseous nitrogen, which is taken from the lines and control devices of the pneumatic holding and transport device.

11. The method according to claim 8, wherein the steps of picking up, positioning, flushing, and contacting are repeated.

* * * * *